(12) United States Patent
Mathe et al.

(10) Patent No.: US 7,068,984 B2
(45) Date of Patent: Jun. 27, 2006

(54) SYSTEMS AND METHODS FOR AMPLIFICATION OF A COMMUNICATION SIGNAL

(75) Inventors: Lennart Mathe, San Diego, CA (US); Thomas Marra, San Diego, CA (US)

(73) Assignee: Telefonaktiebolaget LM Ericsson (publ) (SE)

( * ) Notice: Subject to any disclaimer, the term of this patent is extended or adjusted under 35 U.S.C. 154(b) by 854 days.

(21) Appl. No.: 09/882,738

(22) Filed: Jun. 15, 2001

(65) Prior Publication Data
US 2002/0193085 A1    Dec. 19, 2002

(51) Int. Cl.
H01Q 11/12    (2006.01)

(52) U.S. Cl. .......................... 455/126; 455/23; 455/42; 455/43

(58) Field of Classification Search ................... 455/23, 455/42, 43, 126, 139, 205, 206
See application file for complete search history.

(56) References Cited

U.S. PATENT DOCUMENTS

| | | | |
|---|---|---|---|
| 2,666,133 A | 1/1954 | Kahn | |
| 3,878,474 A * | 4/1975 | Runge | ............ 331/10 |
| 5,486,789 A | 1/1996 | Palandech et al. | |
| 5,696,794 A * | 12/1997 | O'Dea | .......... 375/296 |
| 6,043,707 A | 3/2000 | Budnik | .......... 330/10 |
| 6,084,468 A | 7/2000 | Sigmon et al. | |
| 6,141,541 A | 10/2000 | Midya et al. | |

FOREIGN PATENT DOCUMENTS

EP    0431201    6/1991

* cited by examiner

*Primary Examiner*—Bing Q. Bui
(74) *Attorney, Agent, or Firm*—Coats & Bennett, P.L.L.C.

(57) ABSTRACT

Bandwidth reduction of amplitude and/or phase components of relatively wide bandwidth composite signal. In an exemplary embodiment, an EER amplifier system for CDMA signal amplification includes an amplitude bandwidth reduction module included in an amplitude signal component path and a phase bandwidth reduction module is included in a phase signal component path, for controlling an RF amplifier. The phase bandwidth reduction module may reduce the phase component bandwidth of the input signal by, for example, generating a non-linear relationship between phase signal amplitude and input signal amplitude. The amplitude bandwidth reduction module may reduce the amplitude component bandwidth of the input signal by, for example, generating a non-linear relationship between the supply voltage to the RF amplifier and an input signal amplitude.

42 Claims, 9 Drawing Sheets

SYSTEMS AND METHODS FOR AMPLIFICATION OF A COMMUNICATION SIGNAL

TECHNICAL FIELD

The invention relates generally to communication signal amplification, and more particularly to systems and methods for efficiently amplifying complex or composite communication signals.

BACKGROUND OF THE INVENTION

The communication industry is experiencing unprecedented growth resulting from increased use of electronics for sharing voice, data, and video information from any point in the world to any other point in the world. Both the number of people or users wishing to transmit information and the amount and types of information to be transmitted are increasing at exponential rates. As a result of this growth, there is a need for increased bandwidth of the underlying communication systems, e.g., to enable more information exchange to be handled by existing electronic equipment; thus the increased interest in broadband communications.

One part of a communications system that is particularly important to achieving broadband communication capabilities is the signal processing and signal amplification used for signal transmission. To maximize the signal transmission capabilities, the communication signal processing and the amplifiers need to operate as efficiently as possible. One example is the need for efficient broadband signal amplification in wireless communication systems.

In the wireless communications industry, a premium is placed on the ability to amplify wide bandwidth signals, e.g., spread spectrum signals, in a highly efficient manner. As an example, a typical eighteen-channel base station requires approximately 540 watts of RF power output (30 watts per each channel). Assuming a typical power amplifier efficiency of 5 percent, the amount of power needed to generate a RF power output of 540 watts will be 10.8 kW, with 10.26 kW being dissipated as heat. This dissipated heat represents a drawback in that it not only requires the use of fans and heat sinks to cool the base station, but also translates to wasted energy. In short, the cost to operate a wireless base station increases as the efficiency of the power amplifiers used in the base station decreases. Amplifier efficiency is also important in mobile stations that rely heavily on battery power.

Although various attempts have been made to address amplifier efficiency, it remains difficult to design a high efficiency power amplifier that is able to linearly amplify wide bandwidth signals. The amplification of spread spectrum signals, for example, code division multiple access (CDMA) signals, which typically have high peak-to-average signal amplitude ratios, make it impossible to continuously operate a power amplifier in saturation, thereby reducing the efficiency of the power amplifier even further.

One method that has been proposed to improve amplifier efficiency is envelope elimination and restoration (EER). EER is a technique through which highly efficient radio frequency (RF) power amplifiers can be combined to produce a high efficiency linear amplifier system. In this method, a modulated input signal is split into two paths: an amplitude signal path through which the envelope of the modulated input signal is processed, and a phase signal path through which the phase modulated carrier of the modulated input signal is processed. The envelope of the modulated input signal is amplified through an efficient amplifier, which produces an amplified envelope signal. A high frequency amplifier is then used to modulate the high frequency phase modulated carrier with the amplified envelope signal, thereby generating an amplified replica of the original modulated input signal. The amplifier that generates the amplified envelope signal acts as the power supply to the high frequency amplifier.

Although the use of an EER amplifier system to amplify wide bandwidth modulated signals is, in general, beneficial, its efficiency and maximum modulation bandwidth need be further improved to support signals with even greater bandwidth and increased signal traffic.

SUMMARY OF THE INVENTION

The present invention is generally directed to systems and methods for more efficiently amplifying relatively wide bandwidth signals. In accordance with a main aspect of the invention, the systems and methods employ bandwidth reduction of amplitude and/or phase components of relatively wide bandwidth composite signals. The bandwidth of the phase components may be reduced by, for example, reducing the amplitude of the phase component with reduction in the amplitude of the composite signals. The bandwidth of the amplitude component may be reduced by, for example, increasing the resulting amplitude of the amplitude component for low composite signal amplitude values.

In one embodiment, a RF amplifier in a wireless communications system base station is provided with control circuitry including an amplitude bandwidth reduction module configured to modify an amplitude signal component, and a phase bandwidth reduction module configured to modify a phase signal component, respectively, of a RF input signal to be amplified. The phase bandwidth reduction module may reduce the phase component bandwidth of the input signal by, for example, based on a non-linear relationship between phase signal amplitude and input signal amplitude. For example, the phase bandwidth reduction module may reduce the phase component bandwidth of the input signal by adjusting the amplitude of the input signal to the power amplifier according to the non-linear relationship $A_{phase} = Y_{max} ((1-e^{px})/(1-e^{p}))$. The amplitude bandwidth reduction module may reduce the amplitude component bandwidth of the input signal by, for example, based on a non-linear relationship between the supply voltage to the RF amplifier and an input signal amplitude. For example, the amplitude bandwidth reduction module may include a LUT that reduces the amplitude component bandwidth of the input signal by adjusting the supply voltage VDD to the power amplifier according to the non-linear relationship $VDD=(x+be^{(-x/b)})$ $(x_{max})$. Both the phase component bandwidth reduction and the amplitude component bandwidth reduction can be implemented using lookup tables. The relatively wide bandwidth input signal to be amplified may be, for example, a CDMA signal, and the amplification system may include a relatively wide bandwidth CDMA amplifier using a EER process with reduced bandwidth amplitude and/or phase components to improve the amplification efficiency. The amplifier system may include a signal processing system for EER processing a CDMA input signal, using for example a digital signal processor, prior to input to an amplifier. In one embodiment, the signal processing system will control the power supply voltage and input signal of a RF amplifier. A CDMA baseband or RF signal is input to a polar generator, which outputs an amplitude component signal and a phase component signal derived from the CDMA input signal. The amplitude component signal is modified by an amplitude bandwidth reduction module so as to be bandwidth reduced, and fed into a power supply amplifier that supplies the power supply voltage to the RF amplifier. By way of example, the power supply amplifier may be a VDD amplifier and may be preceded by a delay filter. A phase bandwidth reduction module reduces the phase component signal bandwidth using the amplitude component of the CDMA signal. For example, the phase bandwidth reduction module may adjust the phase component signal of the CDMA signal via a signal processing module so as to achieve bandwidth reduction. A bandwidth reduced phase component signal is then input to the RF amplifier as the signal to be amplified.

Other aspects, objects, and features of the present invention will become apparent from consideration of the following detailed description, taken in conjunction with the accompanying drawings.

DETAILED DESCRIPTION OF THE PREFERRED EMBODIMENTS

Figure 1:
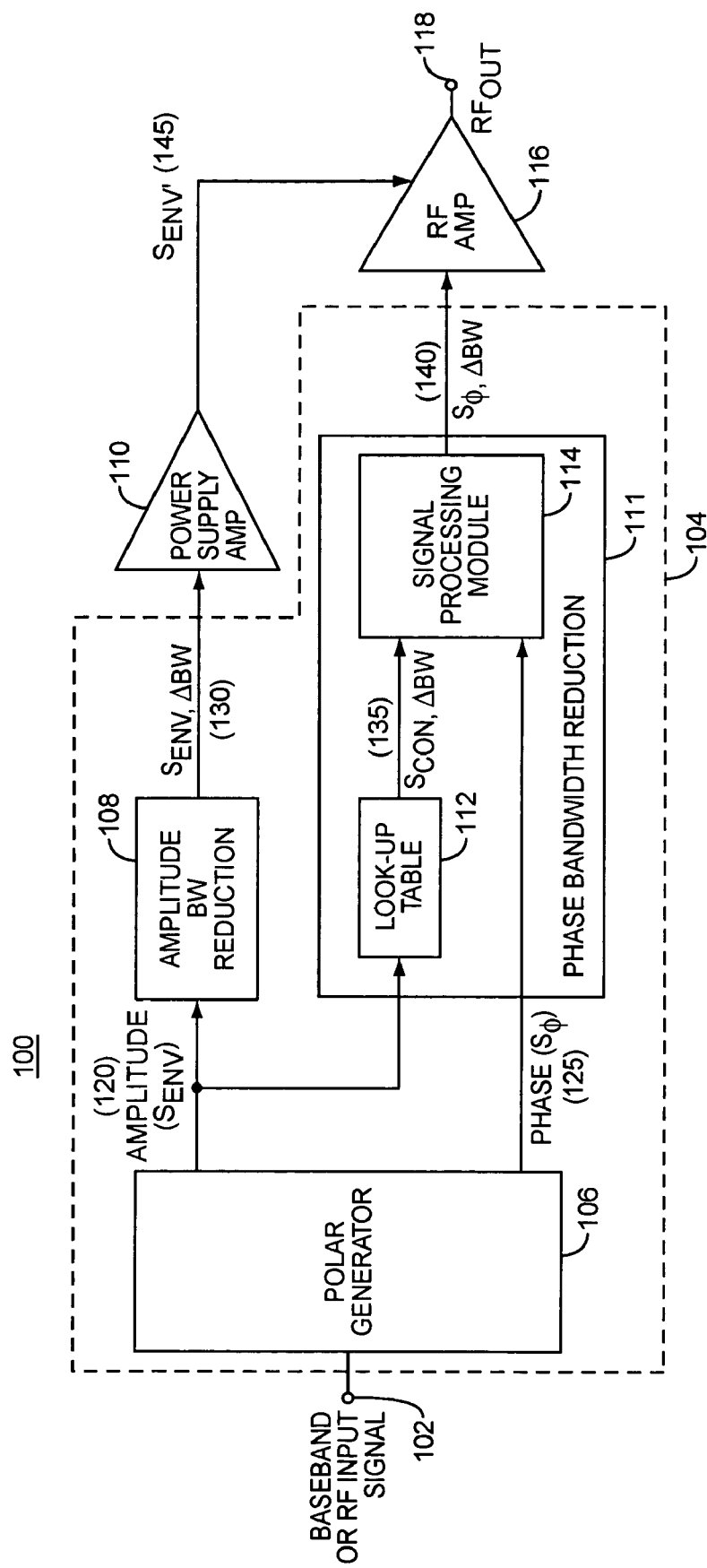
FIG. 1 is a block diagram of an exemplary communication signal amplification system in accordance with the present invention(s).

The present invention may be useful in a wide range of communication signal amplification systems that, for example, amplify high peak-to-average power ratio signals. The invention may be particularly useful in wireless communication systems having RF power amplifiers using the envelope elimination and restoration (EER) technique for amplifying and transmitting CDMA signals, such as CDMAOne, CDMA2000, WCDMA, etc. One such application is RF power amplifiers in base stations and mobile stations of wireless communication systems. The invention may be particularly applicable to improving signal amplification efficiency for wide band communication systems. A wide bandwidth signal may be, for example, one whose spectral bandwidth is much larger than the data rate (e.g., CDMA, W-CDMA, etc.).

One exemplary EER amplifier system in which the present invention may be used is disclosed and described in co-pending U.S. patent application Ser. No. 09/566,194, which is hereby incorporated by reference for all purposes. As indicated therein, the bandwidth of the EER amplitude and phase component signals is not generally reduced. EER systems are typically designed to accommodate the bandwidth of the EER signals without any bandwidth reduction of the amplitude component signal or the phase component signal. However, without bandwidth reduction, certain signaling schemes with wide bandwidths can not be easily implemented using the EER technique.

In general terms, the EER technique works by separating a signal which is simultaneously amplitude and phase modulated into two signals: an amplitude component signal and a phase component signal. The amplitude component signal typically contains all of the amplitude modulation information of the original signal. The phase component signal typically contains all of the phase modulation of the original signal. The amplitude of the phase component signal is typically fixed. This approach improves efficiency beyond the efficiency that may be obtained from simply supplying a compound or complex $RF_{IN}$ input signal having amplitude and phase modulation to an RF amplifier signal input at the price of having to deal with much higher bandwidth amplitude signal and phase signal.

For example, if the original input signal contains rapid phase changes at low amplitudes, then the phase component signal will contain these rapid phase changes but at a much higher amplitude. Without EER, the original low amplitude rapid phase change portion of input signals occur at very small amplitudes and therefore contain very little energy. However, using the EER technique, the original low amplitude, rapid phase changes now occur at much higher amplitudes. The energy of this rapid phase change is much higher resulting in an expansion in signal bandwidth. This higher bandwidth of the phase component signal may pose a problem if the input signal is a baseband signal because it is much more difficult to generate the phase signal and then up convert from baseband frequencies to RF or Microwave frequencies.

The difficulties in generating the phase component signal relates to the high sample rate required for a digital-to-analog converter. The up conversion difficulties are due in large part to performing the required filtering in an upconverter. As the signal bandwidth increases there is a corresponding increase in the difficulty of filtering the mixer output to remove the local oscillator leakage and unwanted image. At low amplitude levels of the original input signal, the amplitude signal will tend to have sharp amplitude changes. These sharp amplitude changes create higher bandwidth frequency components; i.e. the amplitude component signal has much higher bandwidth than the original signal. The higher bandwidth of the amplitude component signal creates a problem because it becomes difficult to construct an amplifier that can efficiently amplify the amplitude signals and maintain the signal quality, i.e. reproduce an accurate amplified version of the amplitude signals, including the high frequency components. This is particularly true for amplitudes near zero when a sharp valley or "V" occurs in the amplitude component signal waveform.

The present invention is directed to addressing these problems and may reduce the bandwidth of the amplitude component signal and/or the phase component signal, while generally preserving the fidelity of the amplified signal and maintaining the benefits of the EER technique, i.e., increased efficiency.

Figure 2A:
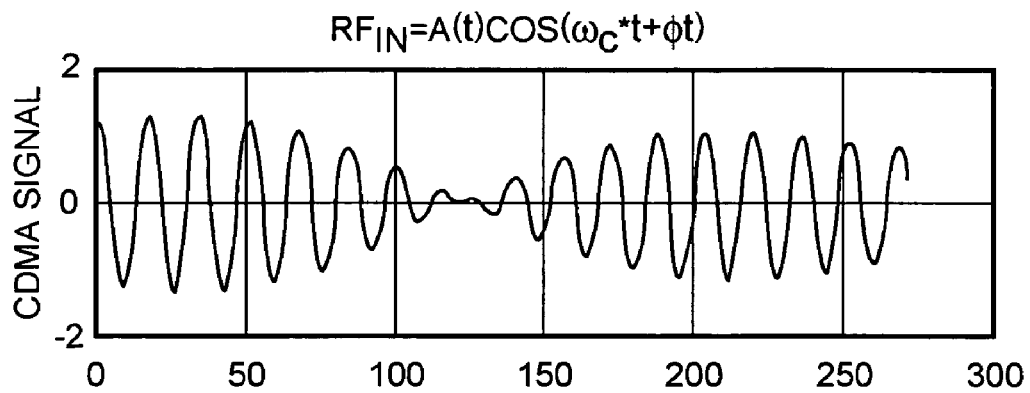
FIG. 2A is a plot of an exemplary CDMA signal input into the system of FIG. 1.

Referring now to FIG. 1, a functional block diagram of one exemplary signal amplification system 100, constructed in accordance with the present inventions, is generally shown. The system 100 comprises a baseband or radio frequency (RF) input 102 into which a baseband or RF signal, $RF_{IN}$, is input, and an RF output 118 from which an amplified RF signal, $RF_{OUT}$, is output. In one embodiment, the system may utilize an envelope elimination and restoration (EER) procedure and the input signal $RF_{IN}$ may be a code division multiple access (CDMA) signal. An exemplary CDMA waveform that may be input into baseband or RF input 102 is depicted in FIG. 2A. As can be seen from FIG. 2A, the input signal $RF_{IN}$ is modulated both in amplitude and phase, and may be represented by the equation:

$RF_{IN}=A(t)\cos[\omega c*t+\phi t]$, where A is the amplitude modulation coefficient, $\omega c$ is the carrier frequency, t is time, and $\phi$ is the phase modulation coefficient. Without modification, amplification of the CDMA input signal $RF_{IN}$ would be relatively inefficient due to the relatively high peak-to-average amplitude ratio of the compound signal waveform. The amplification system 100, however, is configured to amplify the input signal $RF_{IN}$ in a more efficient manner using the EER technique with amplitude component signal and phase component signal including bandwidth reduction. To this end, the system 100 generally comprises a signal processing section 104, which may be a digital signal processor (DSP), a power supply amplifier 110, and RF amplifier 116. The signal processing section may contain a polar generator 106 an amplitude bandwidth reduction module 108 and a phase bandwidth reduction module 111. The output of the amplitude bandwidth reduction module 108 may be coupled to the power supply amplifier 110. The phase bandwidth reduction module 111 may be coupled to the RF amplifier 116. The phase bandwidth reduction module 111 includes a lookup table 112 and signal processing module 114.

Figure 2B:
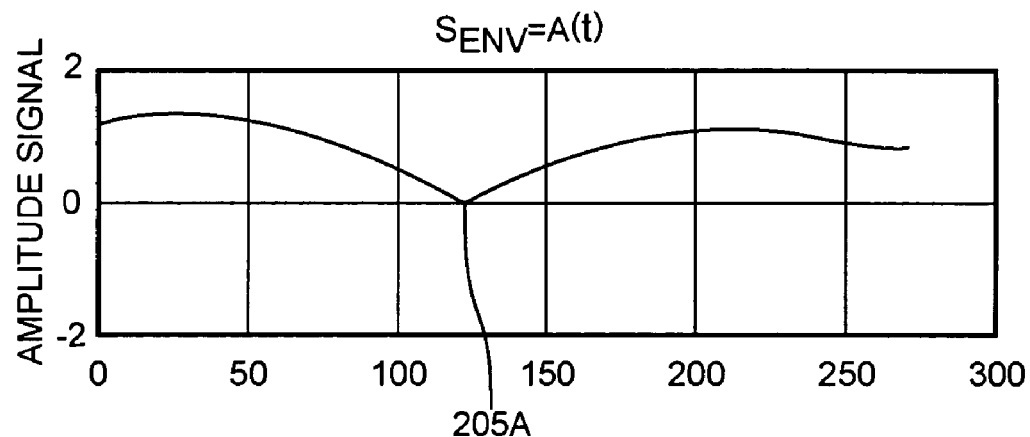
FIG. 2B is a plot of the amplitude component (envelope) derived from the exemplary CDMA signal of FIG. 2A.

The polar generator 106 may split the baseband or RF input signal and/or generate an amplitude component signal and a phase component signal derived from, for example, a CDMA signal applied to input 102 (also referred to as input signal 102). With regard to the amplitude component, an envelope from the input signal 102 is generated, amplitude signal $S_{ENV}$ 120. The envelope signal $S_{ENV}$ 120 represents the amplitude information of the baseband or RF input signal 102. As can be seen from the exemplary waveform of the envelope signal $S_{ENV}$ 120 depicted in FIG. 2B, the relatively high frequency components of the input signal $RF_{IN}$ have been removed, leaving a relatively low frequency envelope signal $S_{ENV}$ equal to the time-varying amplitude modulation coefficient A(t). As will be discussed in more detail below, the envelope signal $S_{ENV}$ 120 may have its bandwidth reduced by the amplitude bandwidth reduction module 108 and amplified by the power supply amplifier circuit 110, generating an amplified envelope signal $S_{ENV}$' 145 that can efficiently power the RF amplifier 116. With regard to the phase component, the polar generator 106 may provide the phase component signal $S_\phi$ 125 from, for example, a CDMA signal 102, to the amplifier system 100. As can be seen from an exemplary waveform of the phase component signal $S_\phi$ 125 depicted in FIG. 2O, in one embodiment (as in the conventional EER amplifier system) the amplitude variance of the input signal RF 102 has been removed, leaving a signal with a uniform amplitude. The phase component signal $S_\phi$ 125 may be equal to the phase modulated carrier $\cos[\omega c*t+\phi t]$. As will be discussed in more detail below, the amplitude of the phase component signal $S_\phi$ 125 may be modified by the phase bandwidth module 111 using the amplitude component signal $S_{ENV}$ 120 so as to reduce bandwidth and improve operation of the amplifier system 100.

Analysis of the power spectral density (PSD) of the amplitude component signal $S_{ENV}$ 120 and phase component signal $S_\phi$ 125 derived from a CDMA signal prior to bandwidth reduction indicates that both signals have larger bandwidth as compared to the original signal. For example, the phase component signal $S_{100}$ 125 may have an undesirable extreme bandwidth of greater than 40 MHz for a CDMA input signal band limited within 1.25 MHz. Inspection of the phase component signal $S_\phi$ 125 reveals rapid phase changes that occur only when the CDMA input signal 102 amplitude is low. Further analysis reveals that the rapid phase changes are responsible for the extended bandwidth.

One approach to reducing the bandwidth of the phase component signal $S_\phi$ 125 is to reduce the amplitude of the phase component signal $S_\phi$ 125 when the CDMA input signal 102 has low amplitude. This may be achieved by adding some amplitude modulation back to the phase component signal $S_\phi$ 125. This method of reducing the phase component signal $S_\phi$ 125 also turns out to have some useful side benefits for a signal driver that may be used as a pre-amplifier to drive the input signal to the RF amplifier 116 ($S_{\phi,\Delta BW}$).

First, experiments have shown that for lower output power amplitudes, much less signal driver power is required to reach saturation of the RF amplifier 116. Reducing the amplitude of the phase component signal $S_\phi$ 125 when the CDMA input signal 102 has low amplitude, reduces the required signal driver power. Second, if the phase signal has a constant amplitude, the signal driver power will leak through the output of the RF amplifier at low CDMA input signal amplitudes. This is caused by the high signal driver power relative to the low power supply voltage from the power supply amplifier 110 at low CDMA input signal amplitudes. With fixed amplitude on the phase signal, the difference of output power amplitude between 0 volts power supply amplifier 110 output voltage (driver leakage only) and full power supply amplifier 110 output voltage is too small to provide sufficient dynamic range for a CDMA signal. Therefore, reducing the amplitude of the phase component signal when the CDMA signal has low amplitude also helps to reduce the signal driver power leakage through the RF amplifier 116 and extends the dynamic range.

Similarly, the amplitude phase component signal $S_{ENV}$ 120 may have an undesirable wide bandwidth of approximately 15–20 MHz for a CDMA input signal 102 band limited within 1.25 MHz. Inspection of the amplitude component signal $S_{ENV}$ 120 reveals sharp valleys or low points ("V's"), that get sharper with lower power amplitudes. For example, these valleys may near an amplitude of 0. One approach to reducing bandwidth is by limiting, rounding or softening the V's so that the amplitude does not reach to 0. Although this might be done by using a low pass filter, in a preferred embodiment it should be done by using a one-to-one relation type formula to avoid creating memory effects.

To address the problems with the wide bandwidth of the amplitude component signal $S_{ENV}$ 120 and phase component signal $S_\phi$ 125, the amplitude bandwidth reduction module 108 and the phase bandwidth module 111 have been introduced to the amplifier system 100. For example, the phase bandwidth reduction module 111 may operate to add back some of the amplitude variation to the phase signal As shown in FIG. 1. lookup table 112 may generate a control signal $S_{con,\Delta BW}$ 135 that will reduce the phase signal $S_\phi$ 125 amplitude at points in time when the input signal 102 has low amplitude. This control signal $S_{con,\Delta BW}$ 135 may be input to a-signal processing module 114 with phase component signal $S_\phi$ 125 so as to output the bandwidth reduced phase signal $S_{\phi\Delta BW}$ 140, supplied to the RF power amplifier 116 as the signal input.

Figure 2C:
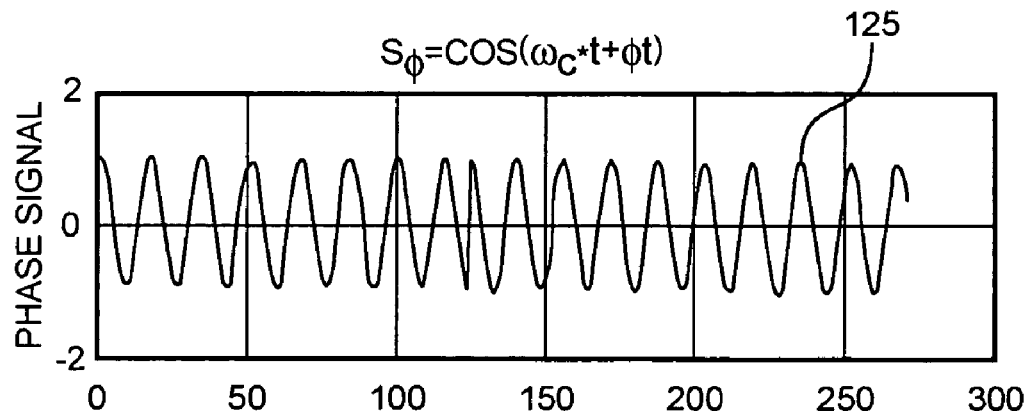
FIG. 2C is a plot of the phase modulated carrier component derived from the CDMA signal of FIG. 2A.
Figure 2D:
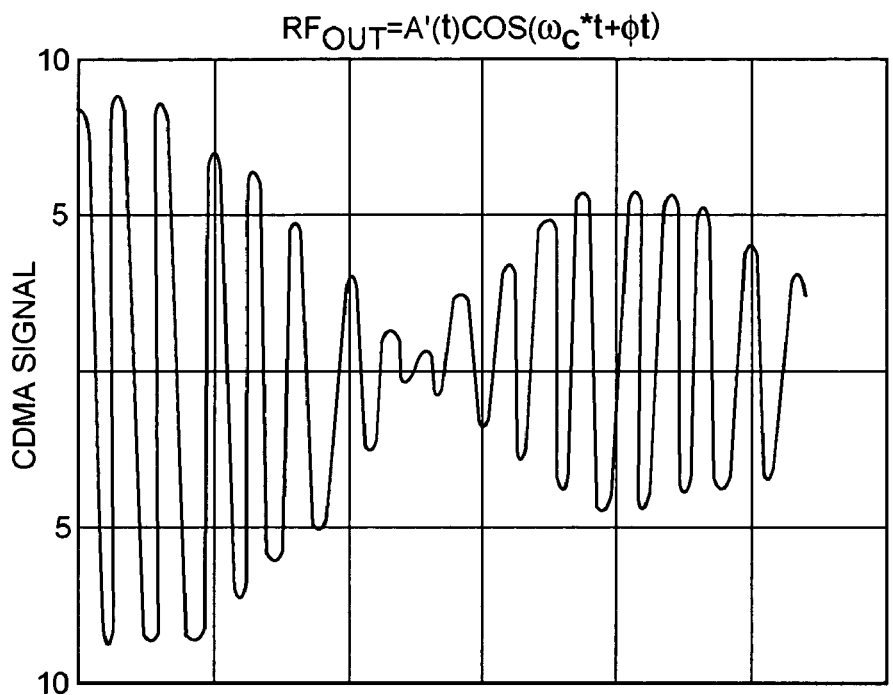
FIG. 2D is a plot of the amplified CDMA signal of FIG. 2A.
Figure 2E:
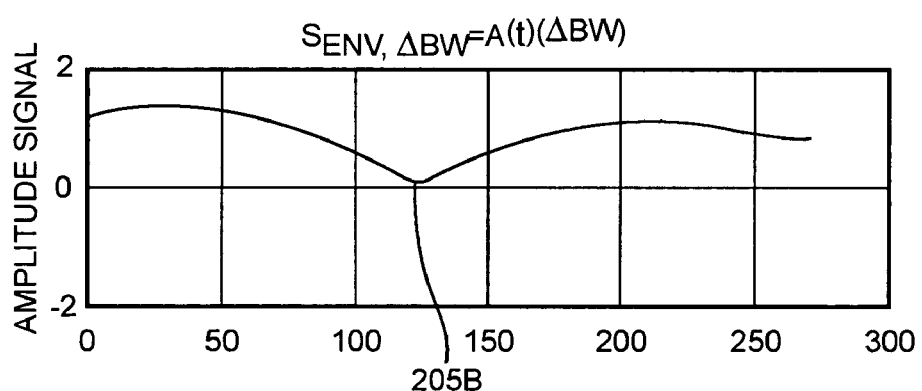
FIG. 2E is a plot of an amplitude bandwidth reduced signal for the amplitude component (envelope) signal derived from the exemplary CDMA signal of FIG. 2A.
Figure 2F:
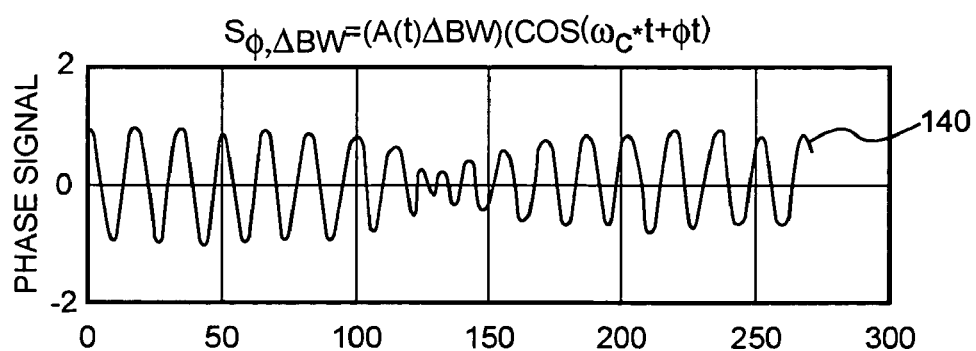
FIG. 2F is a plot of a phase bandwidth reduced signal for the phase component signal derived from the exemplary CDMA signal of FIG. 2A.

To this end, the amplitude of the phase signal $S_{\phi,\Delta BW}$ is preferably selected to maintain operation of the RF power amplifier 116 in saturation. In variations of the present invention, the phase bandwidth reduction module 111 may receive the phase component signal $S_\phi$ 125 and add some amplitude variation prior to the signal processing module 114 or be incorporated into the polar generator 106. In any case, the phase signal $S_{\phi,\Delta BW}$ 140 will have some amplitude variation that may be synchronized to the amplitude variations of the baseband or RF input signal. An exemplary bandwidth reduced phase component signal $S_{\phi,\Delta BW}$ 140 is illustrated in FIG. 2F.

Further, the amplitude bandwidth reduction module 108 may operate to narrow the bandwidth of the amplitude component signal $S_{ENV}$ 120 by, for example, eliminating some of the very low amplitude sharp points of the waveform to produce signal $S_{ENV,\Delta BW}$ 130. This bandwidth adjusted signal $S_{ENV,\Delta BW}$ 130 may then be used as an input signal to the power supply amplifier 110 which then will supply the RF amplifier 116 power signal. An exemplary bandwidth reduced amplitude component signal $S_{ENV,\Delta BW}$ 130 is illustrated in FIG. 2E.

The bandwidth reduced amplified phase signal $S_{\phi,\Delta BW}$ may modulate the amplified bandwidth reduced envelope signal $S_{ENV}'$ to produce the amplified RF output signal $RF_{OUT}$. Specifically, the bias of the RF amplifier 116 (the RF amplifier may include, for example, a power transistor such as a GaAsFET or an LDMOS, and in the case of a JEET-based RF amplifier, the bias is a drain bias $V_{DD}$) is varied in accordance with the amplified envelope signal $S'_{ENV}$ 145, which is applied to the power terminal of the RF amplifier 116 as a time-varying supply voltage $V_{DD}$. Thus, the supply voltage $V_{DD}$ modulates the phase signal $S_{\phi,\Delta BW}$ 140 with the supply voltage $V_{DD}$. One possible output waveform of the output signal $RF_{OUT}$ 118 is exemplified in FIG. 2D. As can be seen, the output signal $RF_{OUT}$ 118 is generally an amplified replica of the input signal $RF_{IN}$ 102.

In one approach to achieve bandwidth reduction of the amplitude component signal and the phase component signal, the amplitude bandwidth reduction module 108 and the phase bandwidth reduction module 111 may derive new signals from the amplitude signal $S_{ENV}$ 120 with reduced signal bandwidths. For example, the amplitude bandwidth reduction module 108 may reduce the amplitude component bandwidth of the input signal using, for example, a non-linear relationship between the supply voltage $S_{ENV}$ 120 and an input signal 102 amplitude. As a result, as illustrated in FIG. 2E, the bandwidth adjusted amplitude component signal $S_{ENV,\Delta BW}$ 130 may have amplitude variations which are slightly less at the valley 205B of the bandwidth adjusted amplitude component signal $S_{ENV,\Delta BW}$ 130 when compared to the valley 205A of the amplitude component signal $S_{ENV}$ 120 shown in FIG. 2B. The amount of reduction in the bandwidth can be varied according to preference. In one embodiment, the amplitude bandwidth reduction module 108 may include, for example, a look up table (LUT) that reduces the amplitude component bandwidth of the input signal according to the following non-linear formula:

$$V_{DD}=(x+be^{(-x/b)})(X_{max}) \qquad \text{Eq. 1}$$

where x is the normalized amplitude of the original signal, $X_{max}$ is the maximum absolute amplitude of the original input signal (baseband or RF), and b is a variable parameter that determines the amount of bandwidth reduction applied to the amplitude component signal $S_{ENV}$ 120. Further, the phase bandwidth reduction module 111 may reduce the phase component bandwidth of the input signal using, for example, a non-linear relationship between the amplitude of the phase signal component and the amplitude of the input signal 102. As a result, as illustrated in FIG. 2F the bandwidth adjusted phase component signal $S_{\phi,\Delta BW}$ 140 may have amplitude variations which may be synchronous with amplitude variations in the input signal 102. In preferred embodiments, the amplitude variations of the bandwidth adjusted phase signal $S_{\phi,\Delta BW}$ 140 may have magnitudes different then that of the input signal 102. In one embodiment, the phase bandwidth reduction module 111 may include a look up table (LUT) 112 that reduces the amplitude of the phase component signal according to the following non-linear formula:

$$A_{phase}=Y_{max}((1-e^{px})/(1-e^p)) \qquad \text{Eq. 2}$$

where x is the normalized amplitude of the original input signal (baseband or RF), $Y_{max}$ is the maximum absolute amplitude of the original input signal, and p is a variable parameter which determines the manner in which the amplitude of the bandwidth adjusted phase signal $S_{\phi,\Delta BW}$ 140 is created versus the original input signal amplitude. As with amplitude component signal bandwidth reduction, the amount of phase signal bandwidth reduction is a matter of preference. In this exemplary case using equation 2, the amount of phase component signal bandwidth reduction may be selected by selecting a particular value for p. Thus, the bandwidth of the phase component signal $S_\phi$ 125 is reduced by reducing the amplitude of the phase component signal $S_\phi$ 125 when the input signal 102 (e.g., CDMA signal) has low amplitude.

Figure 3A:
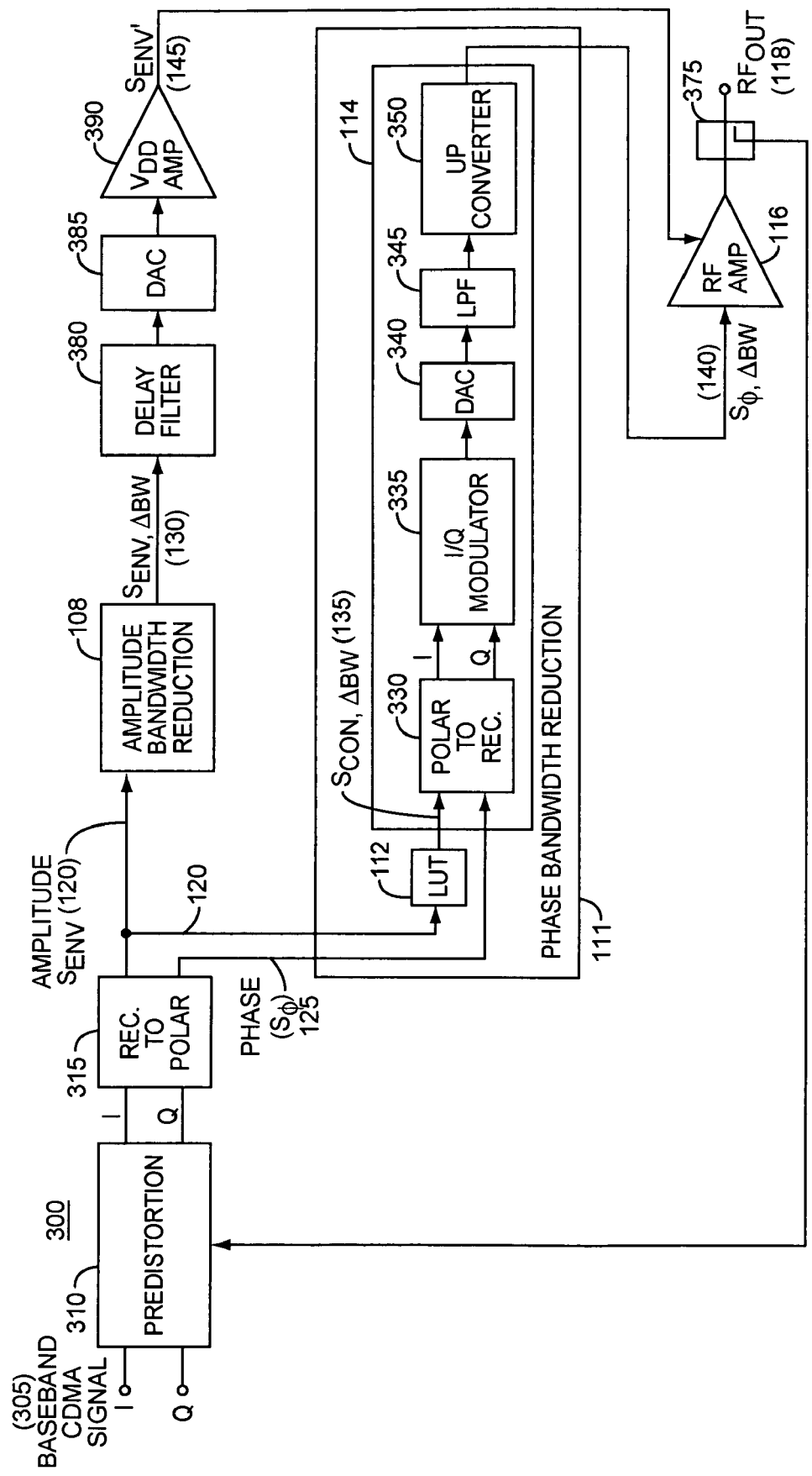
FIGS. 3A and 3B are block diagrams of an exemplary communication signal amplification system in accordance with the present invention(s).
Figure 3B:
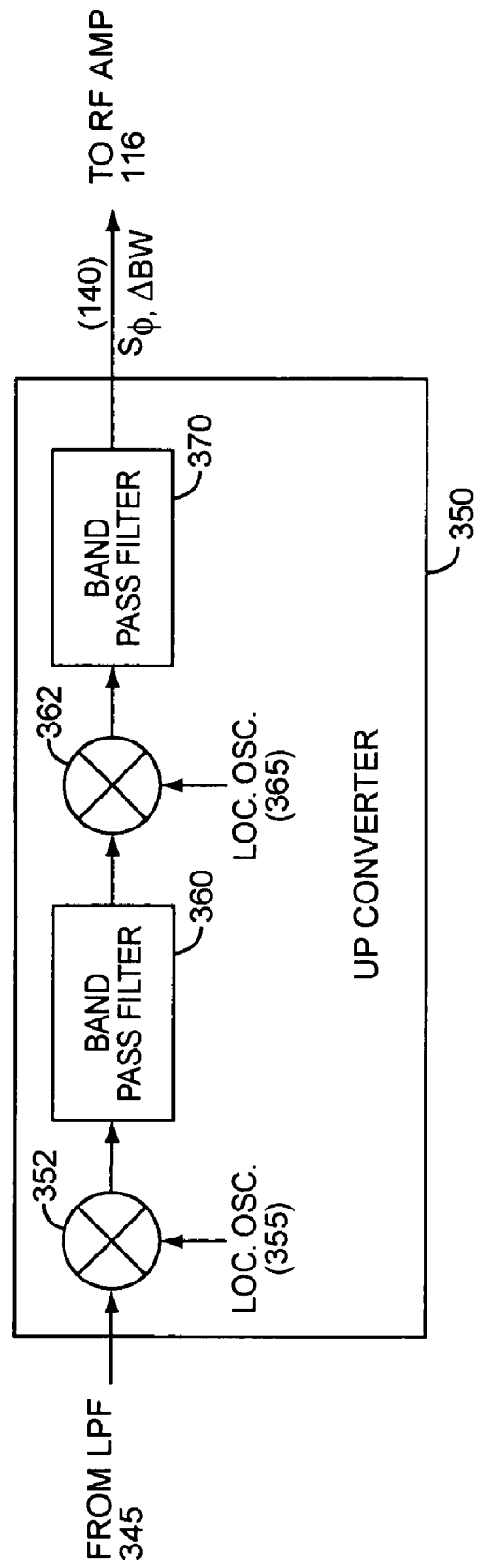

Referring now to FIGS 3A and 3B, a functional block diagram of an exemplary signal amplification system 300 is shown. The system 300 is configured to receive a baseband CDMA signal as an input signal 305 and output an amplified version, $RF_{OUT}$ 118, that generally conforms to the shape of the input signal 305 waveform. In this case, the baseband CDMA signal 305 is input and output as in-phase (I) and quadrature (Q) signals for a predistortion module 310. The predistortion module 310 Q and I outputs are coupled to a rectangular to polar converter 315. The rectangular to polar converter 315 has amplitude components and phase component (polar) outputs. The rectangular to polar converter 315 amplitude component output may be coupled to an amplitude bandwidth reduction module 108 input and a phase bandwidth reduction module 111 input. The rectangular to polar converter 315 phase component output may be coupled to the phase bandwidth reduction module 111. Within the phase bandwidth reduction module 11. the amplitude component is supplied to lookup table 112. which generates a control signal that is supplied to the signal processing module 114. The phase component is supplied to the signal processing module 114. The signal processing module 114 adjusts the amplitude of the phase component responsive to the control signal from the lookup table 112.

The signal processing module 114 includes a polar to rectangular converter 330 that generates I and Q signals based on the phase component signal $S_\phi$ 125 and the control signal $S_{con,\Delta BW}$ 135 from the lookup table 112. The I and Q outputs of the polar-to-rectangular converter 330 are coupled to respective inputs of an I/Q modulator 335. An output of the I/Q modulator 335 is couple to an input of DAC 340. An output of the DAC 340 is coupled to a low pass filter (LPF) 345. An output of the LPF 345 is coupled to an upconverter 350. An output of the upconverter 350 is coupled to the signal input of a RF amplifier 116. The output of the RF amplifier may be coupled to a sensor 375 that provides $RF_{OUT}$ 118 feedback to the predistortion module 310. The upconverter 350, shown in FIG. 3B, may include in series a first up mixer 352 coupled to a first band-pass filter (BPF) 360, the first BPF 360 coupled to a second up mixer 362, and the second up mixer 362 is coupled to a second BPF 370. The first up mixer 352 may be driven by a local oscillator 355 and the second up mixer may be driven by a local oscillator 365. The first BPF 360 may be, for example, a SAW filter.

Tracing the signal path for the amplitude component signal $S_{ENV}$ 120, the output of the amplitude bandwidth reduction module 108 may be coupled to the input of a delay filter 380. An output of delay filter 380 may be coupled to a digital-to-analog converter (DAC) 385. An output of DAC 385 may be coupled to an input of a VDD amplifier 390 (i.e., a power supply amplifier).

In operation, I and Q signals of a baseband CDMA signal 305 are supplied to the predistortion module 310. The predistortion module 310, along with the output sensor 375, operates in a conventional manner to provide amplitude and phase correction ahead of the amplifier to improve the linearity of the amplifier system. The rectangular to polar converter 315 converts the rectangular Q and I samples from the predistortion module 315 into an amplitude component signal $S_{ENV}$ 120 and a phase component signal $S_\phi$ 125. The amplitude component signal $S_{ENV}$ 120 is provided to both the amplitude bandwidth reduction module 108 and the phase bandwidth reduction module 112.

As in the previous embodiments, the amplitude bandwidth reduction module 108 reduces the bandwidth of the amplitude component signal $S_{ENV}$ 120 by modifying it so as to limit the very low amplitudes to higher amplitudes. This modified amplitude component signal $S_{ENV,\Delta BW}$ 130 is input into the delay filter 380. The delay filter 380 may be needed to compensate for delays of the phase signal component that may occur in the upconverter 350. The delay filter 380 may have delay filter coefficient inputs that are dynamically adjusted by, for example, a DSP, that monitors and tracks delay of the amplitude component signal propagation and phase component signal propagation, to adjust delay variations related to temperature, production, and frequency. In any case, the bandwidth adjusted amplitude component signal $S_{ENV,\Delta BW}$ 130 (with or without delay) is input to DAC 385, converted into an analog signal, and input as the signal input to $V_{DD}$ amplifier 390. $V_{DD}$ amplifier 390 provides an amplified version of the bandwidth adjusted amplitude component signal $S_{ENV,\Delta BW}$ 130 as $S_{ENV}$' 145 to the RF amplifier 116 as a variable power supply voltage.

The phase bandwidth reduction module 111 processes the amplitude component signal $S_{ENV}$ 120 to generates a control signal $S_{CON,\Delta BW}$ 135 that can adjust the amplitude of the phase component signal $S_\phi$. The control signal $S_{CON,\Delta BW}$ 135 is fed to polar-to-rectangular converter 330. The polar-to-rectangular converter 330 takes the phase component signal $S_\phi$ 125 and the phase bandwidth reduction control signal $S_{CON,\Delta BW}$ 135 and produces I and Q bandwidth adjusted phase component signal in rectangular format. These I and Q signals are then converted by the I/Q modulator 335. The digital output signal of the I/Q modulator 335 is converted to an analog signal and fed to a low-pass filter (LPF) 345. LPF 345 filters the analog signal and outputs it to the upconverter 350. The upconverter 350 takes the bandwidth reduced phase component signal and increases its frequency from baseband to RF. For example, the baseband frequency may be MHz and the first up mixer 352 may increase the signal with a 150 MHz local oscillator 355 to produce a combined 160 MHz signal. This 160 MHz frequency signal is then filtered with BPF 360. The filtered 160 MHz signal may be increase in frequency further to 1960 MHz by the second up mixer 362 having a 1800 MHz frequency signal provided by the second local oscillator 365. This 1960 MHz signal is filtered by second bandpass filter 370 to become bandwidth reduced phase component signal $S_{\phi,\Delta BW}$ 140 that is input as the signal input to RF amplifier 116.

Figure 4:
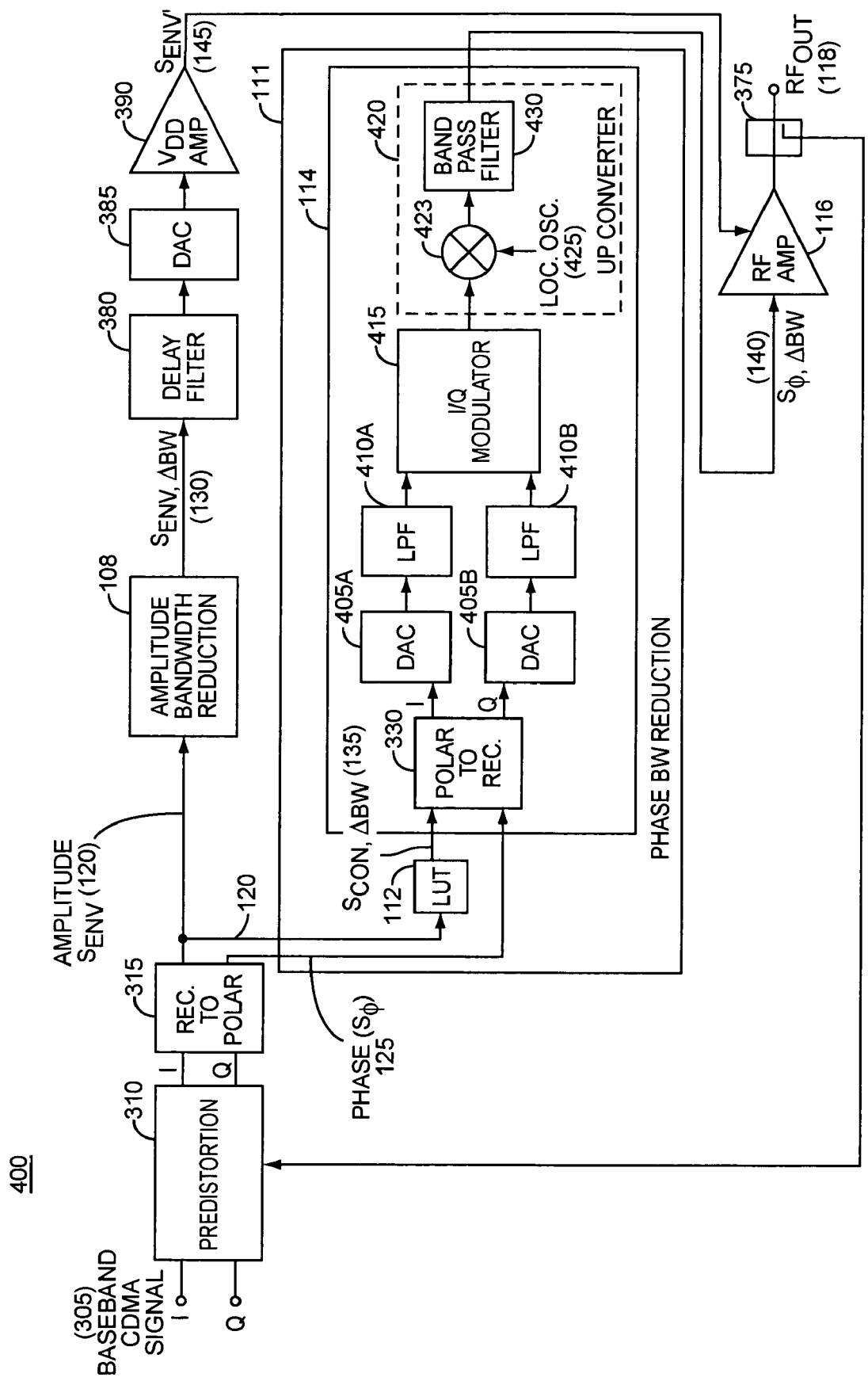
FIG. 4 is a block diagram of still another exemplary communication signal amplification system in accordance with the present invention(s).

Referring now to FIG. 4, a functional block diagram of another exemplary signal amplification system 400 is shown. The amplification system 400 is similar to the amplification system 300 and is configured to receive a baseband CDMA signal as an input signal 305 and output an amplified version, $RF_{OUT}$ 118, that generally conforms to the shape of the input signal 305 waveform. Likewise, the communication system 400 may include bandwidth reduction modules 108 and 111 for reducing the bandwidth of the amplitude component signal $S_{ENV}$ 120 and the phase component signal $S_\phi$ 125 respectively. However, the phase signal processing path of this embodiment is configured so as to convert the bandwidth reduced I and Q signals to analog signals prior to I/Q modulation into a composite signal. As such, the I output of the polar-to-rectangular converter 330 coupled to an input of DAC 405A and the Q output of the polar-to-rectangular converter 330 is coupled to an input of DAC 405B. An output of DAC 405A is coupled to an input of a LPF 410A and an output of DAC 405B is coupled to an input of a LPF 410B. The outputs of LPF 410A and LPF 410B are coupled to the I/Q modulator 415. Finally, the output of the I/Q modulator is coupled to the input of an upconverter 420.

In the embodiment of FIG. 4, the up converter includes only a single up mixer 423 and a single BPF 430. Further, the embodiment of FIG. 4 has the advantage of being able to use a slower DAC clock rate than the embodiment of FIG. 3 for the same bandwidth CDMA signal. Therefore it is possible to create wider bandwidth signals using the embodiment of FIG. 4 for a given DAC technology. On the other hand, the embodiment of FIGS 3A and 3B has the advantage that the I/Q Modulator is digital and, therefore, very accurate. The analog I/Q Modulator in FIG. 4 has both amplitude and phase imbalance, which distorts the signal and creates memory effects that limit the effectiveness of predistortion.

The operation of this embodiment is in most respects the same, the amplification system uses the EER technique to convert a baseband CDMA signal 305 into an amplitude component signal $S_{ENV}$ 120 and phase component signal $S_\phi$ 125. The amplitude component signal $S_{ENV}$ 120 is bandwidth adjusted by amplitude bandwidth reduction module 108 and the phase component signal $S_\phi$ 125 is bandwidth reduced via a phase bandwidth reduction module 111. The amplitude bandwidth reduction module 108 and phase bandwidth reduction module 111 may operate using non-linear equations, such as those shown in previously mentioned Eq.

1and Eq. 2, respectively. The operation of the embodiments using these equations will now be explained in more detail.

If the previously describe embodiments include an amplitude bandwidth reduction module 108 and/or a phase bandwidth reduction module 111 that operate using Eq. 1 and Eq. 2, respectively, they are inherently adjustable using the variables b and p. It is worth noting that although the embodiments have been explained having both an amplitude bandwidth reduction module 108 and a phase bandwidth reduction module 111, the amplification system may include either one of these modules or both modules.

Figure 5:
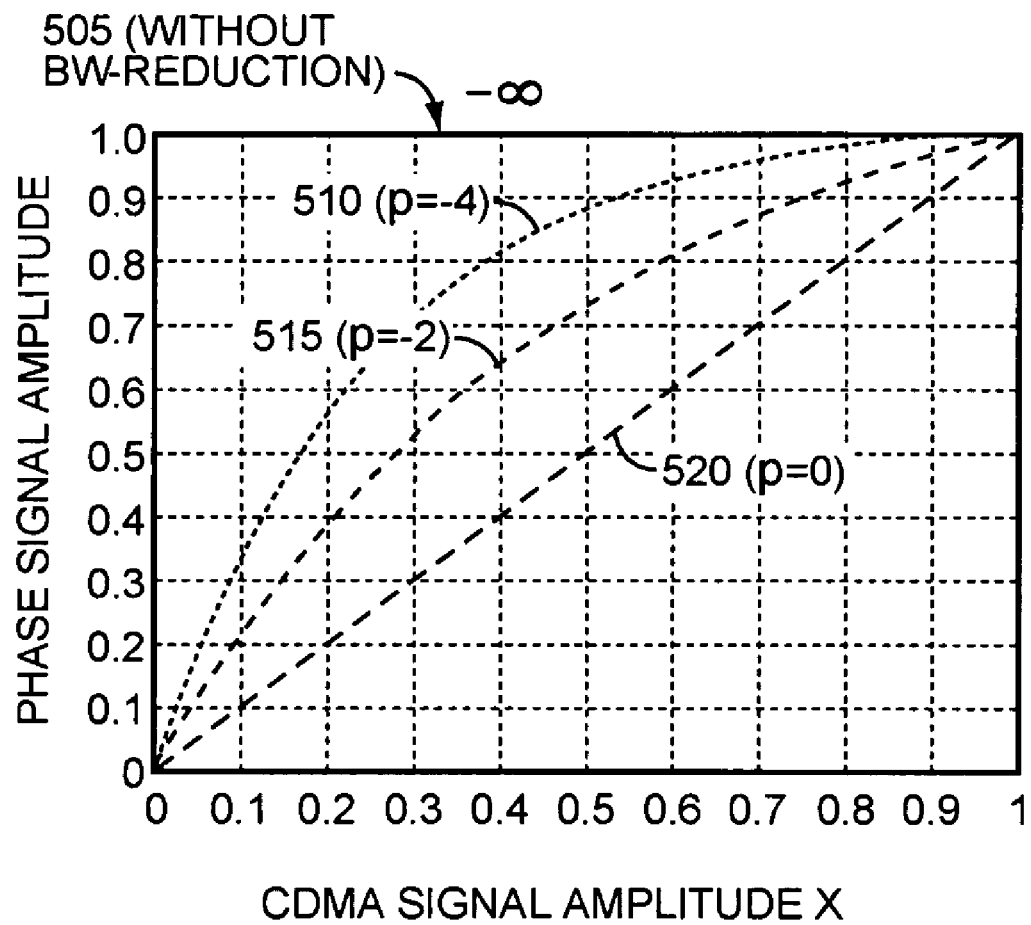
FIG. 5 illustrates a comparison of various alternatives for reducing bandwidth of the amplitude component signal and an original amplitude signal derived from an input signal.

Referring to FIG. 5, if the amplifier system includes a phase bandwidth reduction module 111 that operates according to Eq. 2, $A_{phase}=Y_{max}((1-e^{px})/(1-e^p))$ then the control signal $S_{CON,\Delta BW}$ 135 will operate to produce a bandwidth adjusted phase signal $S_{\phi,\Delta BW}$ 140 that varies in a non-linear manner according to the curves shown, depending on the selection of a value for variable p. For example, if p=−4, the phase signal amplitude will vary as shown by curve 510 so as to have almost no amplitude variation at higher amplitudes (i.e., normalized CDMA input signal amplitude x=1 to 0.5) and significant amplitude variation at lower amplitudes (i.e., normalized CDMA input signal amplitude x=0 to 0.5). If p=−2, the phase signal amplitude will vary as shown by curve 515 so as to have a reasonable amount of amplitude variation at both higher amplitudes (i.e., normalized CDMA input signal amplitude x=1 to 0.5) and with slightly more amplitude variation at lower amplitudes (i.e., normalized CDMA input signal amplitude x=0 to 0.5). For reference, lines 505 and 520 are provided. Line 505 illustrates the conventional EER phase signal amplitude without bandwidth reduction that shows no phase signal amplitude variation regardless of amplitude variation of the CDMA input signal amplitude. Line 520 illustrates phase signal amplitude variation if the phase signal variation tracks the CDMA signal amplitude variation exactly (i.e., for p=0 the phase signal would have the same amplitude variation of the CDMA input signal).

Figure 6:
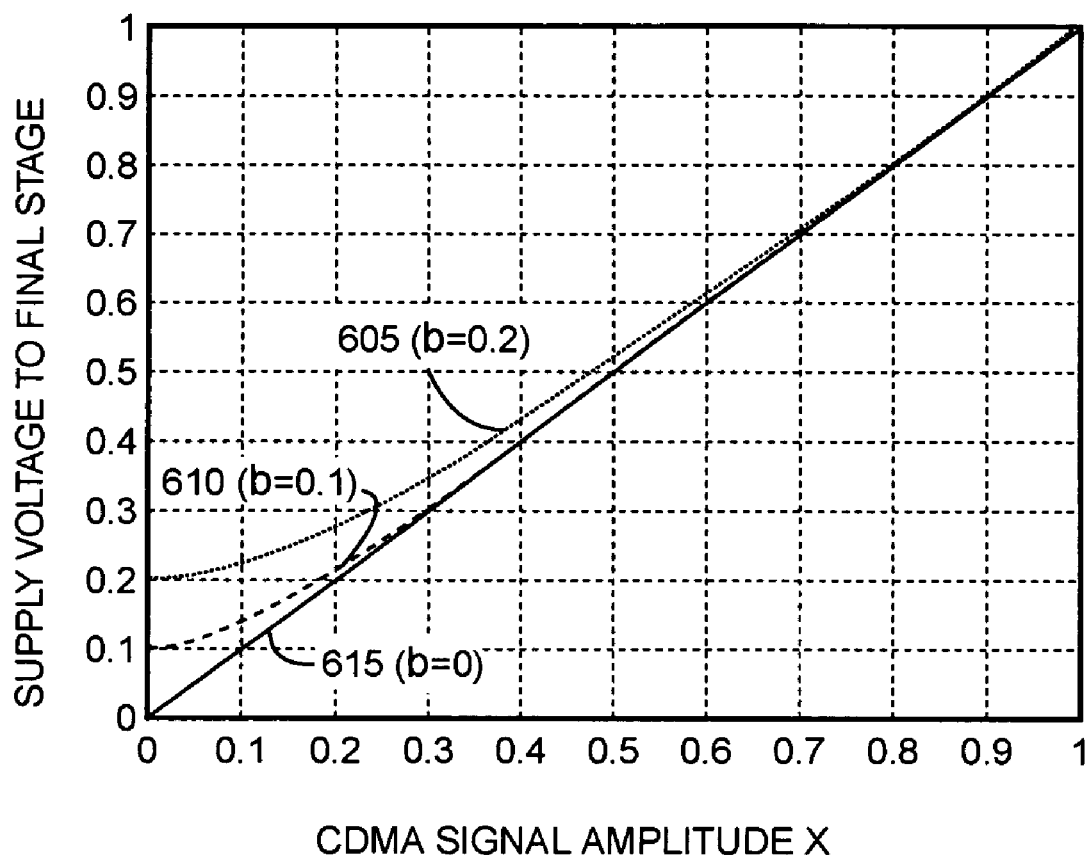
FIG. 6 illustrates a comparison of various alternatives for reducing bandwidth of the phase component signal and an original phase signal derived from an input signal.

Referring now to FIG. 6, if the amplifier system includes an amplitude bandwidth reduction module 108 that operates according to Eq. 1, $V_{DD}=(x+be^{(-x/b)})(X_{max})$, then the bandwidth adjusted amplitude component signal $S_{ENV,\Delta BW}$ 130 will vary in a non-linear manner according to the curves shown, depending on the selection of a value for variable b. For example, if b=0.1, the bandwidth adjusted amplitude component signal $S_{ENV,\Delta BW}$ 130 will vary as shown by curve 610 so as to have almost a one-to-one amplitude variation at higher amplitudes (i.e., normalized CDMA input signal amplitude x=1 to 0.3) and slightly less than a one-to-one amplitude variation at lower amplitudes (i.e., normalized CDMA input signal amplitude x=0 to 0.3). If b=0.2, the bandwidth adjusted amplitude component signal $S_{ENV,\Delta BW}$ 130 will vary as shown by curve 605 so as to have slightly less than a one-to-one variation at higher amplitudes (i.e., normalized CDMA input signal amplitude x=1 to 0.3) and little amplitude variation at lower amplitudes (i.e., normalized CDMA input signal amplitude x=0 to 0.3). The amplitude reductions at the lower amplitude regions represents the limiting of the valleys in the CDMA signal amplitude waveform. Line 615 illustrates the conventional EER amplitude signal amplitude variation without bandwidth reduction that shows a linear variation of the amplitude component signal $S_{ENV,\Delta BW}$ for b=0, regardless of amplitude variation of the CDMA input signal amplitude.

Figure 7:
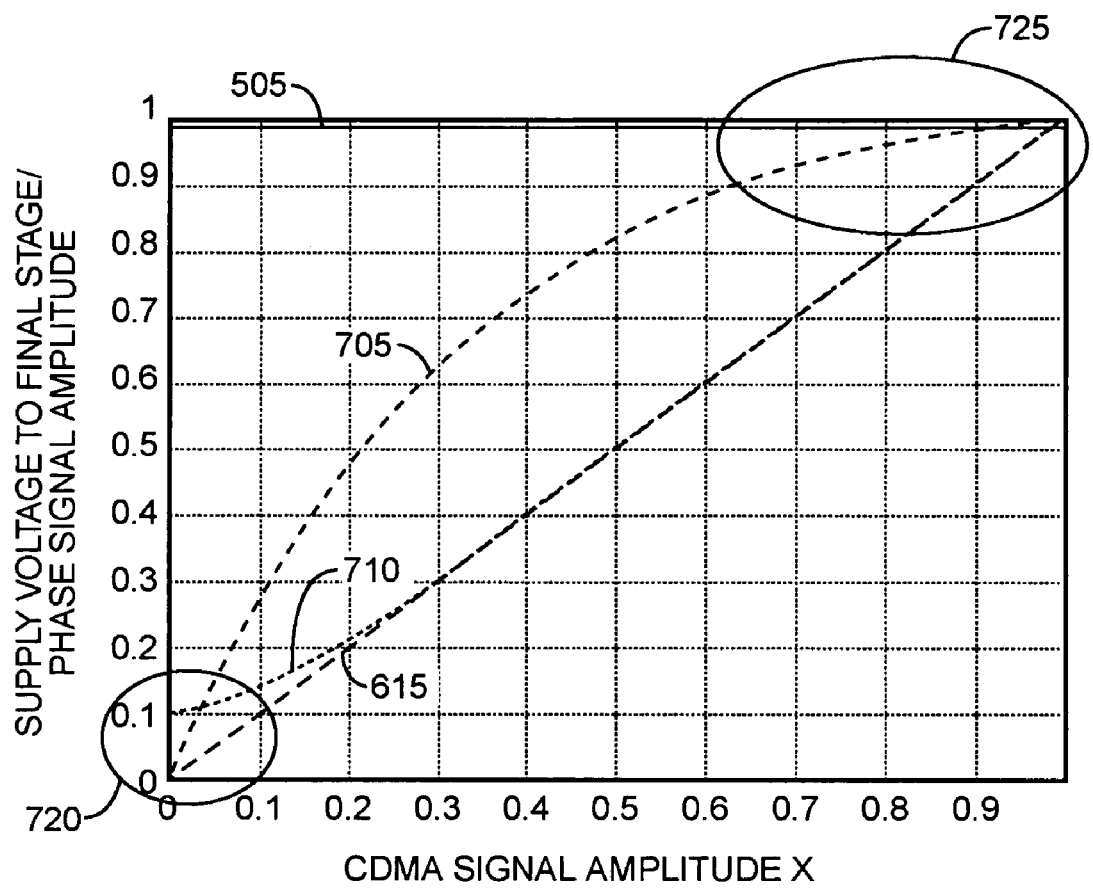
FIG. 7 illustrates a comparison of one alternative bandwidth reduction for both the amplitude component signal and the phase component signal with the original amplitude signal and phase signal as derived from an input signal.

Referring to FIG. 7, the bandwidth reduction equations are illustrated for one preferred embodiment having both an amplitude bandwidth reduction module 108 and a phase bandwidth reduction module 111 in which the amplitude bandwidth reduction module 112 has variable. b=0.1 (line 710) and phase bandwidth reduction module 111 has variable p=−3 (line 705). Again, line 505 represents the conventional EER phase component signal $S_\phi$ 125 amplitude and line 615 represents the conventional EER amplitude component signal $S_{ENV}$ 120 amplitude variations for changes in CDMA signal amplitude variation. At high CDMA signal amplitudes identified generally by the encircled region 725, the amplitude modulation of the amplified CDMA signal is done primarily on the power supply voltage signal $S_{ENV}'$145 (e.g., VDD) and the phase signal has almost constant amplitude. As a result, there is just enough to keep the power transistor in the RF amplifier 116 saturated. This helps maximize efficiency. At low CDMA amplitudes identified generally by the encircled region 720, the amplitude modulation is done on the phase signal $S_{\phi,\Delta BW}$ 130 and the power supply voltage signal $S_{ENV}'$145 (e.g., VDD) is almost constant. This increases dynamic range of the amplifier system and reduces many of the problems with operating the power supply amplifier (e.g., VDD amplifier) at low input signal power.

Although the bandwidth reduction of the amplitude component signal and/or phase component signal might cause minor adverse effects to the amplifier system linearity, the inclusion of a predistortion module is sufficient to correct the minor linearity degradation. Further, the gain in an upconverter can vary over temperature, production and frequency. Thus, there may be a need for power sensing the phase component signal to make sure that the output devices are saturated, but not over saturated. This may be done by using a local processor on the RF amplifier or included as part of an overall transmit power tracking loop(TPTL) than might be included in a wireless communication base station.

In any case, various benefits are achieved by reducing the bandwidth of the amplitude component signal and the phase component signal in an EER amplifier system. For example, by reducing the bandwidth of the phase signal: (1) a "normal" upconverter can be used for the phase signal, although the amplifier may still need several times the CDMA signal bandwidth; (2) the average RF power from the signal driver maybe reduced; (3) the dynamic range of the amplifier system is increased; and (4) the clock rate for the DAC or DACs used is greatly reduced. Some exemplary benefits of reducing the bandwidth of amplitude signal includes: (1) reduction in the operation bandwidth requirement for the power supply amplifier; and (2) the power supply amplifier no longer needs to be able to operate efficiently or "reach" down to 0 volts.

Although particular embodiments of the present invention have been shown and described herein, it will be understood that it is not intended to limit the invention to the preferred embodiments and it will be obvious to those skilled in the art that various changes and modifications may be made without departing from the spirit and scope of the present invention. Thus, the invention is intended to cover alternatives, modifications, and equivalents, which may be included within the spirit and scope of the invention as defined by the claims.

All publications, patents, and patent applications cited herein are hereby incorporated by reference in their entirety for all purposes.

What is claimed is:

1. A communication system, comprising:
an RF amplifier having a power supply input and a signal input; and a phase bandwidth reduction module coupled to the signal input and configured for modifying an amplitude of a phase component of an input signal provided on the signal input to reduce a bandwidth of the phase component.

2. The communication system of claim 1, further comprising:
a power supply amplifier coupled to the power supply input; and
an amplitude bandwidth reduction module coupled to an input of the power supply amplifier, the amplitude bandwidth reduction module configured for modifying amplitude variations of an amplitude component of the input signal to reduce the bandwidth of the amplitude component.

3. The communication system of claim 2, further comprising:
a delay filter coupled between an output of the amplitude bandwidth reduction module and the input of the power supply amplifier.

4. The communication system of claim 3, further comprising:
a polar generator having an input for receiving the input signal, a first output for providing a phase signal component of the input signal, and a second output for providing the amplitude component of the input signal to the amplitude bandwidth reduction module.

5. The communication system of claim 4, wherein the polar generator includes a rectangular to polar converter.

6. The communication system of claim 5, further comprising:
a polar to rectangular converter having a first input coupled to an output of the phase bandwidth reduction module, a second input coupled to a first output of the rectangular to polar converter, and an output coupled to the RF amplifier.

7. The communication system of claim 6, further comprising:
an upconverter coupled to the output of the polar to rectangular converter and the signal input of the RF amplifier.

8. The communication system of claim 7, wherein the upconverter includes at least one local oscillator and one bandpass filter (BPF).

9. The communication system of claim 8 further comprising:
at least one digital to analog converter (DAC), one low pass filter (LPF), and one in-phase/quadrature (I/Q) modulator coupled together and coupled between the output of the polar to rectangular converter and an input of the upconverter.

10. The communication system of claim 9, wherein the input signal is a baseband or radio frequency signal that has a high peak-to-average power ratio.

11. The communication system of claim 10, wherein the input signal is a code division multiple access (CDMA) signal.

12. The communication system of claim 11, wherein the input signal is a CDMAOne, CDMA2000, or a WCDMA signal.

13. The communication system of claim 12, wherein the communication system amplifies the input signal using envelope elimination and restoration (EER).

14. The communication system of claim 13, wherein the phase bandwidth reduction module modifies the amplitude component of the phase component of the input signal based on a non-linear relationship between phase signal amplitude and CDMA signal amplitude.

15. The communication system of claim 14, wherein the amplitude bandwidth reduction module modifies amplitude variations of the amplitude component of the input signal based on a non-linear relationship between supply voltage to the RF amplifier and the CDMA signal amplitude.

16. The communication system of claim 14, wherein the phase bandwidth reduction module modifies the amplitude component $A_{phase}$ of the phase component of the input signal based on the non-linear relationship $$A_{phase} = A_{max}((1-e^{px})/(1-e^p)),$$

where $A_{max}$ represents a maximum amplitude of the input signal, x represents a normalized amplitude of the input signal, and p represents a variable adjustment parameter.

17. The communication system of claim 15, wherein the amplitude bandwidth reduction module modifies the amplitude variations VDD of the amplitude component of the input signal based on the non-linear relationship $VDD=(x+be^{(-x/b)})(V_{DDmax})$, where $V_{DDmax}$ represents a maximum amplitude of the input signal, x represents a normalized amplitude of the input signal, and b represents a variable adjustment parameter.

18. The communication system of claim 2, wherein the phase bandwidth reduction module modifies the amplitude component of the phase component of the input signal based on a non-linear relationship between phase signal amplitude and CDMA signal amplitude.

19. The communication system of claim 18, wherein the amplitude bandwidth reduction module modifies amplitude variations of the amplitude component of the input signal based on a non-linear relationship between supply voltage to the RF amplifier and CDMA signal amplitude.

20. The communication system of claim 18, wherein the phase bandwidth reduction module modifies the amplitude component $A_{phase}$ of the phase component of the input signal based on the non-linear relationship $$A_{phase} = A_{max}((1-e^{px})/(1-e^p)),$$

where $A_{max}$ represents a maximum amplitude of the input signal, x represents a normalized amplitude of the input signal, and p represents a variable adjustment parameter.

21. The communication system of claim 19, wherein the amplitude bandwidth reduction module modifies the amplitude variations VDD of the amplitude component of the input signal based on the non-linear relationship $$VDD=(x+be^{(-x/b)})(V_{DDmax}),$$

where $V_{DDmax}$ represents a maximum amplitude of the input signal, x represents a normalized amplitude of the input signal, and b represents a variable adjustment parameter.

22. A base station in a wireless communications system, comprising:
an RF amplifier having a power supply input and a signal input; and
a phase bandwidth reduction module coupled to the signal input and configured for modifying an amplitude of a phase component of an input signal provided on the signal input to reduce a bandwidth of the phase component.

23. The base station of claim 22, further comprising:
a power supply amplifier coupled to the power supply input; and
an amplitude bandwidth reduction module coupled to an input of the power supply amplifier, the amplitude bandwidth reduction module configured for modifying amplitude variations of an amplitude component of the input signal to reduce the bandwidth of the amplitude component.

24. The base station of claim 23, further comprising:
a delay filter coupled between an output of the amplitude bandwidth reduction module and the input of the power supply amplifier.

25. The base station of claim 24, wherein the phase bandwidth reduction module modifies the amplitude component of the phase component of the input signal based on a non-linear relationship between phase signal amplitude and CDMA signal amplitude so as to reduce power leak through from a signal driver.

26. The base station of claim 25, wherein the amplitude bandwidth reduction module modifies amplitude variations of the amplitude component of the input signal based on a non-linear relationship between supply voltage to the RF amplifier and CDMA signal amplitude.

27. The base station of claim 25, wherein the phase bandwidth reduction module modifies the amplitude component $A_{phase}$ of the phase component of the input signal based on the non-linear relationship $$A_{phase}=A_{max}((1-e^{px})/(1-e^p)),$$

where $A_{max}$ represents a maximum amplitude of the input signal, x represents a normalized amplitude of the input signal, and p represents a variable adjustment parameter.

28. The base station of claim 26, wherein the amplitude bandwidth reduction module modifies the amplitude variations VDD of the amplitude component of the input signal based on the non-linear relationship $$VDD=(x+be^{(-x/b)})(V_{DDmax}),$$

where $V_{DDmax}$ represents a maximum amplitude of the input signal, x represents a normalized amplitude of the input signal, and b represents a variable adjustment parameter.

29. The base station of claim 28, wherein the input signal is a baseband or radio frequency signal that has a high peak-to-average power ratio.

30. The base station of claim 29, wherein the input signal is a code division multiple access (CDMA) signal.

31. The base station of claim 30, wherein the input signal is a CDMAOne, CDMA2000, or a WCDMA signal.

32. The base station of claim 30, wherein a base station transmitter amplifies input signal using envelope elimination and restoration (EER).

33. A method for processing a communication signal, comprising:
separating an input signal into an amplitude component signal and a phase component signal;
modifying an amplitude of the phase component signal to reduce a bandwidth of the phase component signal; and
controlling a signal input of an RF amplifier with the modified phase component signal.

34. The method of claim 33, further comprising:
modifying amplitude variations of the amplitude component signal to reduce a bandwidth of the amplitude component signal; and
controlling a supply voltage input of the RF amplifier with the modified amplitude component signal.

35. The method of claim 34, wherein modifying the amplitude of the phase component signals comprises modifying the amplitude of the phase component based on a non-linear relationship between the amplitude of the phase component signal and a CDMA signal amplitude.

36. The method of claim 35, wherein modifying the amplitude variations of the amplitude component signal comprises modifying the amplitude variations based on a non-linear relationship between a supply voltage to the RF amplifier and the CDMA signal amplitude.

37. The method of claim 35, wherein modifying the amplitude of the phase component signals based on the non-linear relationship between the amplitude of the phase component signal and the CDMA signal amplitude comprises modifying the amplitude of the phase component signals based on $A_{phase}=A_{max}((1-e^{px})/(1-e^p))$, where $A_{max}$ represents a maximum amplitude of the input signal, x represents a normalized amplitude of the input signal, and p represents a variable adjustment parameter.

38. The method of claim 37, wherein modifying the amplitude variations based on the non-linear relationship between the supply voltage to the RF amplifier and the CDMA signal amplitude comprises modifying the amplitude variations based on $VDD=(x+be^{(-x/b)})(V_{DDmax})$, where $V_{DDmax}$ represents a maximum amplitude of the input signal, x represents a normalized amplitude of the input signal, and b represents a variable adjustment parameter.

39. The method of claim 38, wherein the input signal is a baseband or radio frequency signal and has a high peak-to-average power ratio.

40. The method of claim 39, wherein the input signal is a code division multiple access (CDMA) signal.

41. The method of claim 40, wherein the input signal is a CDMAOne, CDMA2000, or a WCDMA signal.

42. The method of claim 41, wherein envelope elimination and Restoration (EER) is used to amplify the input signal.

* * * * *

UNITED STATES PATENT AND TRADEMARK OFFICE
CERTIFICATE OF CORRECTION

PATENT NO. : 7,068,984 B2
APPLICATION NO. : 09/882738
DATED : June 27, 2006
INVENTOR(S) : Mathe et al.

It is certified that error appears in the above-identified patent and that said Letters Patent is hereby corrected as shown below:

Col. 5, line 62, being a new paragraph with the word "With".
Col. 5, line 67, change "FIG. 20" to --FIG. 2C--.
Col. 7, line 4, add a period after "to the phase signal".
Col. 7, line 5, add a comma after "shown in FIG. 1".
Col. 8, line 10, begin a new paragraph with the word "Further".
Col. 8, line 61, change "module 11" to --module 111-- and then change the period to a comma.
Col. 8, line 62, change the period after "table 112" to a comma.
Col. 11, line 3, change "describe" to --described--.

Signed and Sealed this

Fifth Day of September, 2006

JON W. DUDAS
*Director of the United States Patent and Trademark Office*